US008206562B2

(12) United States Patent
Walls et al.

(10) Patent No.: US 8,206,562 B2
(45) Date of Patent: Jun. 26, 2012

(54) APPARATUS AND METHOD FOR THE APPLICATION OF A MATERIAL LAYER TO DISPLAY DEVICES

(75) Inventors: John Michael Walls, Coalville (GB); Desmond Gibson, Coalville (GB); William Young, Cambridgeshire (GB); Nalinkumar Patel, Cambridgeshire (GB); Nicoletta Anathassopoulou, Cambridgeshire (GB)

(73) Assignees: Cambridge Display Technology Limited, Cambridgeshire (GB); System Control Technologies Limited, Hayward, CA (US)

( * ) Notice: Subject to any disclaimer, the term of this patent is extended or adjusted under 35 U.S.C. 154(b) by 910 days.

(21) Appl. No.: 11/816,494

(22) PCT Filed: Feb. 16, 2006

(86) PCT No.: PCT/GB2006/000550
§ 371 (c)(1),
(2), (4) Date: Jul. 28, 2008

(87) PCT Pub. No.: WO2006/087558
PCT Pub. Date: Aug. 24, 2006

(65) Prior Publication Data
US 2009/0065741 A1 Mar. 12, 2009

(30) Foreign Application Priority Data

Feb. 18, 2005 (GB) .................................. 0503401.2

(51) Int. Cl.
*C25B 11/00* (2006.01)
*C23C 14/00* (2006.01)

(52) U.S. Cl. .......... 204/298.16; 204/192.15; 204/192.17
(58) Field of Classification Search ............. 204/298.15, 204/298.16, 298.2, 192.15, 192.17
See application file for complete search history.

(56) References Cited

U.S. PATENT DOCUMENTS

| 5,247,190 | A | 9/1993 | Friend et al. | |
|---|---|---|---|---|
| 5,556,519 | A * | 9/1996 | Teer | 204/192.12 |
| 5,723,873 | A | 3/1998 | Yang et al. | |
| 5,798,170 | A | 8/1998 | Zhang et al. | |
| 6,255,774 | B1 | 7/2001 | Pichler | |
| 6,353,083 | B1 | 3/2002 | Inbasekaran et al. | |
| 6,423,419 | B1 | 7/2002 | Teer et al. | |
| 6,452,218 | B1 | 9/2002 | Cao | |
| 6,605,823 | B1 | 8/2003 | Pichler et al. | |
| 2002/0179900 | A1 | 12/2002 | Buechel et al. | |
| 2003/0129407 | A1 | 7/2003 | Teer et al. | |

FOREIGN PATENT DOCUMENTS

| GB | 2385062 A | 8/2003 |
|---|---|---|
| WO | 9114797 A | 10/1991 |
| WO | 2005110698 A | 11/2005 |

* cited by examiner

*Primary Examiner* — Stephen Rosasco
(74) *Attorney, Agent, or Firm* — LeClairRyan, a Professional Corporation

(57) ABSTRACT

The invention relates to a method and apparatus for the application of material to form a layer of an organic electroluminescent device. The material is sputter deposited typically from at least one target of material held in respect to a magnetron in a coating chamber. The magnetrons used can be unbalanced magnetrons and/or are provided with other magnetrons and/or magnet arrays in a closed field configuration. The material is found to be deposited in a manner which prevents or minimises damage to the device and hence reduces or removes the need for a barrier layer to be applied.

46 Claims, 2 Drawing Sheets

APPARATUS AND METHOD FOR THE APPLICATION OF A MATERIAL LAYER TO DISPLAY DEVICES

This application is a national stage application under 35 U.S.C. §371 of PCT/GB2006/000550, filed Feb. 16, 2006, and claims the priority benefit of GB 0503401.2, filed Feb. 18, 2005.

FIELD OF THE INVENTION

The invention relates to optical devices and particularly, although not necessarily exclusively to apparatus and a method for the application of material to form a layer of an organic electroluminescent device.

BACKGROUND OF THE INVENTION

One class of device is that which uses an organic light emitting device, or "OLED", or as the active component of a photocell or photodetector (a "photovoltaic" device). The general structure which is utilised for this type of device is an organic layer with semiconducting characteristics which is provided on opposing planar surfaces with, on one side a cathode for injecting or accepting negative charge carriers (electrons) and on the other side with an anode for injecting or accepting positive charge carriers (holes) into the organic layer.

In organic electroluminescent devices, electrons and holes are injected into the organic layer. The electrons and holes combine to generate excitons that undergo radiative decay. This is disclosed, for example in WO 90/13148, where the organic light-emissive material is a polymer, namely poly(p-phenylenevinylene) ("PPV"). Other light emitting polymers known in the art include polyfluorenes and polyphenylenes. In U.S. Pat. No. 4,539,507 the organic light-emissive material is of the class known as small molecule materials, such as (8-hydroxyquinoline) aluminium ("Alq$_3$"). WO 99/21935 discloses the class of materials known as dendrimers.

In most devices which are capable of practical implementation at least one of the electrodes is transparent to allow photons to escape the device.

Organic photovoltaic devices have the same construction as an organic electroluminescent device, with the exception that charge is separated rather than combined. An example of a photovoltaic device is described in, for example, WO 96/16449.

In known forms the OLED can be produced on a glass or plastic substrate coated with a transparent electrically conducting first electrode such as indium-tin-oxide ("ITO"). A layer of a thin film of at least one electroluminescent organic material covers the first electrode followed by the layer of electroluminescent organic material and a cathode layer is applied to cover the layer of electroluminescent organic material.

Conventional devices can now be described for a conventional polymer electroluminescent device (it will be appreciated that non-polymeric electroluminescent materials may equally be used in place of the polymeric electroluminescent materials described below). The standard architecture of the device includes a transparent glass or plastic substrate, an anode of indium tin oxide and a cathode. An electroluminescent polymer layer is located between the anode and the cathode. If the cathode was applied using a conventional sputtering operation a barrier layer is required to be provided to protect the polymer from damage. The electroluminescent polymer can be present alone or as a plurality of polymers.

Where a plurality of polymers are deposited, they may comprise a blend of the electroluminescent polymer with at least one of a hole transporting material and an electron transporting material as disclosed in WO 99/48160. Alternatively, the electroluminescent polymer layer can be formed from a single, block copolymer that comprises regions selected from two or more of hole transporting regions, electron transporting regions and emissive regions as disclosed in, for example, WO 00/55927 and U.S. Pat. No. 6,353,083. Each of the functions of hole transport, electron transport and emission may be provided by separate polymers or separate regions of a single polymer. Alternatively, more than one function may be performed by a single region or polymer. In particular, a single polymer or region may be capable of both charge transport and emission. Each region may comprise a single repeat unit, e.g. a triarylamine repeat unit may be a hole transporting region. Alternatively, each region may be a chain of repeat units, such as a chain of polyfluorene units as an electron transporting region. The different regions within such a polymer may be provided along the polymer backbone, as per U.S. Pat. No. 6,353,083, or as groups pendant from the polymer backbone as per WO 01/62869.

Further layers may be provided between the anode and the cathode. For example, a hole injection layer such as poly (ethylene dioxythiophene)/polystyrene sulfonate (PEDOT-PSS) as disclosed in EP 0901176 and EP 0947123 or polyaniline as disclosed in U.S. Pat. No. 5,723,873 and U.S. Pat. No. 5,798,170 may be provided between the anode and the electroluminescent material. Further layers that may be present include layer for transporting charge (i.e. holes or electrons); layers for blocking charge; and exciton blocking layers.

For ease of processing, it is preferred that the polymer(s) used in the device are soluble. Substituents such as $C_{1-10}$ alkyl or $C_{1-10}$ alkoxy may usefully be selected to confer on the polymer solubility in a particular solvent system. Typical solvents include mono- or poly-alkylated benzenes such as toluene and xylene or THF. Preferred solution processing techniques for deposition of polymers include spin-coating for unpatterned devices or simple segmented displays and inkjet printing for high resolution displays, in particular full colour displays. Inkjet printed, full colour devices may be made by inkjet printing red, green and blue electroluminescent polymers into wells (formed by standard photolithographical techniques) to form corresponding red, green and blue subpixels. Inkjet printing of electroluminescent materials is described in more detail in EP 0880303.

The cathode includes a layer comprising a material that has a workfunction allowing injection of electrons into the electroluminescent layer. The cathode may consist of a single material such as a layer of aluminium, however it is preferred that the cathode includes a material having a workfunction of less than 3.5 eV, more preferably less than 3.0 eV. For example, it may comprise a plurality of metals, for example a bilayer of calcium and aluminium as disclosed in WO 98/10621 or elemental barium disclosed in WO 98/57381, Appl. Phys. Lett. 2002, 81 (4), 634 and WO 02/84759. Alternatively or additionally, the cathode may comprise a thin layer of dielectric material to assist electron injection, for example lithium fluoride disclosed in WO 00/48258 or barium fluoride, disclosed in Appl. Phys. Lett. 2001, 79(5), 2001.

The device will typically suffer degradation if exposed to atmospheric moisture or oxygen. The device is therefore preferably sealed from the environment using a suitable encapsulant.

If light is emitted through a transparent substrate then the device may be encapsulated using a metal enclosure having a cavity into which the device is received and a perimeter that is glued to the substrate to form an airtight seal.

If light is emitted through a transparent cathode then a transparent encapsulant is required. Suitable transparent encapsulants include a sheet of glass located over the device and glued to the substrate or alternating layers of a polymer and a ceramic forming a transparent multilayer barrier having a tortuous path for ingress of moisture or oxygen.

Electroluminescent devices may be monochrome, multicolour or full colour devices.

There are two basic types of OLED.

A first form is referred to as a bottom emitter OLED. This form allows light to pass through the transparent ITO anode and the substrate. This form of device normally has a cathode including a layer of low workfunction metal formed by thermal or e-beam evaporation which does not cause any significant damage to the underlying organic material. In one embodiment this layer of low workfunction metal can be a bilayer of barium with an external coating of aluminium to protect the reactive barium layer.

A second form of OLED is that which includes control circuitry associated with each pixel of the OLED and located underneath the emissive material and is referred to as an active matrix OLED. The control circuitry is not transmissive which means that the total area available for bottom emission (so-called aperture ratio) is reduced and can adversely affect the capabilities and range of uses of this form of device. As a result an OLED device which allows emission through the top of the device is desirable.

It is preferred that the same cathode is used for top emitters as bottom emitters, however bottom emitter cathodes are typically applied at a thickness that make them opaque. Although suitable metals may be transparent at very low thickness, their lateral conductivity at such thicknesses is poor. Also, if a reactive metal is used such as calcium or barium then it needs to be capped with a protective layer. There are relatively few conductive materials that retain transparency at higher thicknesses. One such suitable class of materials are transparent conducting oxides (TCOs), for example indium tin oxide (ITO) and doped Zinc Oxide (ZnO), for example indium zinc oxide (IZO).

The problem with ITO and other materials of this type is how to apply the same onto the device in a manner which allows the required adhesion and also prevents damage being caused to the material onto which the ITO or similar material is being applied. It is known that ITO is not amenable to evaporation and so attempts have been made previously to sputter the ITO and/or use barrier layers which are first applied in order to protect against damage being caused by the sputter process on the material layer. However the need to use barrier layers is generally undesirable but has to date been regarded as being necessary in order to avoid the damage caused by sputtering. An aim of the invention is to minimise the thickness of the barrier layer or entirely eliminate the need for a barrier layer.

One known form of sputtering is where a series of magnetrons are provided in a coating chamber in which the substrates to be coated are held or are positioned adjacent thereto. The magnetrons include a target of the material which is to be deposited by sputtering. The magnetrons are provided in an arrangement which can be referred to as a closed field in which adjacent or opposite magnetrons and/or magnet arrays are arranged, typically with reverse polarity of the respective outer magnets between adjacent magnetrons and/or magnet arrays, so as to provide a field within which the plasma which is generated is retained or "trapped" and is relatively dense while producing sputtering of the material from the targets at relatively high rates of deposition. Furthermore the magnetrons are typically unbalanced. The devices or substrates to be coated can be biased, for example, by the application of a voltage thereto, or held at a floating potential. An example of a closed field system is disclosed in the patent GB2258343.

SUMMARY OF THE INVENTION

The aim of the present invention is to provide apparatus and a method which allows for the application of at least one layer of material during manufacture of an electronic or optoelectronic device, in particular an organic electroluminescent device in a manner which allows the required properties of the applied material to be obtained by the application of a coherent layer and to allow the material to be applied either directly onto an electroactive layer of the device or onto a minimal thickness barrier layer in a manner which minimises the damage to the surface onto which the material is applied.

The substrate that the material is deposited onto may consist of a single material, for example a layer of glass or plastic onto which the material is deposited, or may be a laminate comprising a plurality of layers, for example a laminate comprising a layer of glass or plastic, an electrode layer (in particular an anode) and one or more additional layers, in particular organic layers.

Where one or more organic layers are present, it is preferred that at least one organic layer is an organic electroluminescent layer.

DETAILED DESCRIPTION OF THE INVENTION

Figure 1:
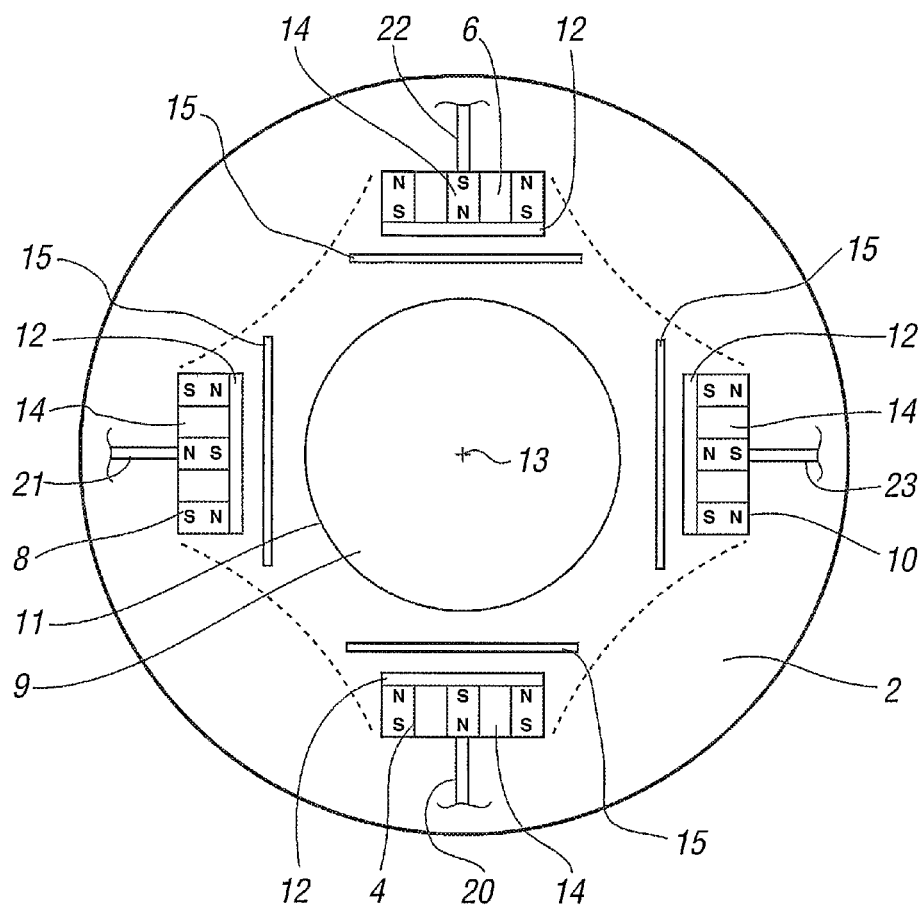
FIG. 1 illustrates an apparatus in accordance with one embodiment of the invention.

In a first aspect of the invention there is provided apparatus for the application of a layer of material by sputter deposition onto an organic electroluminescent device, said device including an electroluminescent layer applied directly or indirectly to substrate, said apparatus including a holder for the device and on which the device is located in a coating chamber, said coating chamber including at least one target of the material to be deposited onto the device, said target provided as part of an unbalanced magnetron, said coating chamber including at least one other magnetron and/or magnet array and wherein said magnetrons and/or magnet array are mutually located in the coating chamber such that the polarity of the outer or ring magnet of a first magnetron or magnet array is the opposite to the polarity of the outer or ring magnet of at least one magnetron or magnet array adjacent thereto and the material is applied with a material deposition energy in the coating chamber of less than 50 eV.

In one embodiment the closed field configuration includes a series of unbalanced magnetrons. Typically each of the unbalanced magnetrons is provided with a target of a material which can be selectively applied during the coating process simultaneously with other targets or in a sequential manner.

In one embodiment the closed field configuration includes at least one magnet array which is not provided for the deposition of material but is magnetically configured and positioned with respect to the at least one magnetron in the coating chamber so as to provide said closed field configuration.

In whichever embodiment the magnetron and/or magnet array configuration allows the retention of the magnetic flux within the coating chamber and hence maintains the relatively dense plasma in the coating chamber. In one embodiment the devices to be coated are positioned within the plasma. In an alternative embodiment the devices are positioned adjacent the plasma.

Typically the organic electroluminescent device includes a series of layers and at least one of the layers is applied using apparatus other than that in the closed field configuration. In one embodiment the apparatus is provided as part of a coating assembly, said assembly including at least one further arrangement for the forming of a further layer on the device. In one embodiment a further arrangement includes any, or any combination of, an inkjet printer and/or an encapsulator. In one embodiment the closed field configuration deposition apparatus, inkjet printer and/or encapsulator are provided as part of an integrated coating system, with movement means provided to move the device through and past the layer forming apparatus.

In one embodiment at least one of the targets of the unbalanced magnetrons is formed of a material to be applied to the devices to form a barrier layer over the electroluminescent layer prior to the application of the material to form a cathode of the device.

In one embodiment the device onto which the material is to be applied has previously been formed with an anode layer, a electroluminescent layer and the cathode layer is applied thereon either directly or onto a barrier layer covering the electroluminescent layer, using the apparatus. Where present, suitable barrier materials include: wide bandgap semiconductors in particular ZnS or ZnSe; and organic materials, for example copper phthalocyanine (CuPc).

The barrier layer may be deposited directly onto the electroluminescent layer. Alternatively, one or more additional layers may be disposed between the electroluminescent layer and the barrier layer, in which case the barrier may serve to protect these additional layers from sputter damage. Examples of such layers include organic electron transporting materials and/or layers of low workfunction metal to assist injection of electrons into the organic layer(s). Suitable low workfunction metals include metals having a workfunction of less than 3.5 eV, more preferably less than 3 eV, in particular low workfunction alkali earth metals such as calcium and barium.

In one embodiment the material which is applied onto the device is indium tin oxide (ITO), or doped ZnO. When Indium tin oxide is deposited the same can be done using an Indium-tin target and reacting the same in oxygen in the chamber to produce ITO or an Indium-tin oxide target can be used. In the latter case, the deposition is usually carried out in a reactive oxygen background because the ITO can otherwise be depleted in Oxygen.

In one embodiment a plurality of the devices are provided as a batch in the coating chamber to allow the material to be applied thereto. In this arrangement the devices are mounted on a holder or carrier in the form of a drum or carousel driven to rotate about an axis and located within the unbalanced magnetron closed field. In one embodiment the holder employs a planetary motion drive arrangement to move the devices. Alternatively, the device can be held horizontally on a non-rotating or rotating platen. The deposition can be "sputter-up" or "sputter-down". Sputter up is preferred because material particles which are generated are minimised. Sputter-down makes for easier device handling.

In an alternative embodiment the devices are transported into the coating chamber by a drive mechanism which allows the devices to move in a linear path and as they pass through the coating chamber they pass through the unbalanced magnetron closed field which allows the application of the material thereon. In-line coating is suitable for high throughput of large substrates such as flat panel displays. They are usually sputter down, sometimes sputter up and occasionally, the substrates are held vertically.

Typically the coating chamber is held in vacuum during the coating process and control means are provided to allow a suitable gas or gases to be selectively introduced to allow protection of the targets and the control of the characteristics of the material being applied from the targets. Gases are typically selectively introduced such as argon (or other inert gas) to sputter the target to produce the deposition flux. Reactive gases are introduced such as oxygen or nitrogen to produce oxides or nitrides.

It is preferred that the apparatus includes one or more loading/unloading chambers which are connected to the coating chamber and which are held selectively at room pressure or in vacuum.

In a preferred embodiment the targets are located behind shields or shutters, which can be selectively opened to allow material sputtered from the targets to reach the devices at the required times. When the shields are over the targets, the targets may be operational or held in an on/off or idling state.

Typically the device is a top emissive OLED device with the material applied using the apparatus described herein forming a transparent, electrically conducting thin film over layer of electroluminescent material. In one embodiment the transparent, electrically conducting film is Indium tin oxide (ITO).

In one embodiment the electroluminescent materials selected are provided to provide a visual affect of any, or any combination, of red, blue and green, in particular a full colour display.

In a further aspect of the invention there is provided apparatus for the application of a layer of material by sputter deposition onto an organic electroluminescent device, said device including a substrate having an anode layer and an electroluminescent layer applied directly or indirectly thereto (a substrate), said apparatus including a holder for the device and on which the device is located in a coating chamber, said coating chamber including at least one target of the material to be deposited onto the device, said target provided as part of an unbalanced magnetron, said coating chamber including at least one other magnetron and/or magnet array and wherein said magnetrons and/or magnetic array are mutually located in the coating chamber such that the polarity of the outer or ring magnet of a first magnetron or magnet array is the opposite to the polarity of the outer or ring magnet or at least one magnetron or magnet array adjacent thereto and the layer of material is applied in the coating chamber onto the exposed outer surface of the device formed by the electroluminescent layer or onto a barrier layer overlying said electroluminescent layer.

In a further aspect of the invention there is provided apparatus for the application of a layer of material by sputter deposition onto an organic electroluminescent device, said device including an electroluminescent layer applied directly or indirectly to a substrate, said apparatus including a holder for the device and in which the device is located in a coating chamber, said coating chamber including at least one target of the material to be deposited onto the device, said target provided as part of an unbalanced magnetron, said coating chamber including at least one other magnetron and/or magnet array and wherein said magnetron and/or magnet array are mutually located in the coating chamber such that the polarity of the outer or ring magnets of the first magnetron or magnet array is the opposite to the polarity of the outer or ring magnet of at least one magnetron or magnet array adjacent thereto.

In a yet further aspect of the invention there is provided a method for the application of material to form a layer of an electronic or optoelectronic device, said method including the steps of placing the device to which the material is to be applied in a coating chamber, introducing a gas or gasses into the coating chamber, operating one or a series of unbalanced magnetrons in the coating chamber which may also be used to sputter deposit the said material from at least one material target associated with the unbalanced magnetron in a directed manner onto the device.

In one embodiment the magnetrons and/or magnet arrays are arranged such that the polarity of the outer or ring magnet of a first magnetron or magnet array is the opposite of the polarity of the outer or ring magnet of at least one magnetron or magnet array adjacent thereto.

In one embodiment the material is applied with no bias voltage applied to the devices during deposition of the material.

In one embodiment the devices achieve a floating potential within the coating chamber. Preferably the floating potential is in the range of less than 50V and the material deposition energy is less than 50 eV. The floating potential occurs on the substrate carrier when no external or bias voltage is applied. In the closed field, the floating potential is less than 50V. At these low voltages, the ion current density is high (typically >1 mA·cm-2). The low voltage means low energy of deposition and minimal substrate damage. In a preferred embodiment floating potential is achieved on both the devices and the carrier and is typically in the range of 20-30 eV with a high ion current density. The power supply used can be of any suitable form but it is preferred that pulsed d.c. power is used as it removes the risk of arcing occurring.

In one embodiment the magnetrons used may also be provided at a floating potential in addition to the devices and carrier.

Typically the material deposition energy is preferred to be relatively low so as to minimise or remove the risk of physical damage to the polymer material. In one embodiment the polymer material has a surface which forms the external surface on the device onto which the said material is applied. Alternatively a barrier layer of a further material is first applied to the polymer layer prior to application of the material in accordance with the invention and that further material forms the external surface of the device.

Typically the layer of material once applied, has a low stress as the energy of deposition is low and the degree of ionisation is high.

In one embodiment the coating chamber is held at a higher process pressure to reduce the energy of deposition as the relatively high process pressure results in energy-reducing gas scattering events.

In one embodiment an inert gas is introduced into the chamber and preferably the inert gas is fed close to the magnetron because it is used to sputter the target. However gas will diffuse around the chamber and some inert gas may bombard the substrate. In one embodiment the gas is argon, or alternatively is xenon which has a larger atom size and which is found to reduce the possibility of damage being caused to the polymer layer as it has lower penetration depth In one embodiment the thickness of the layer of material is built up by a number of passes of the device past the material target or the passing of the device past a plurality of targets of the material.

In one embodiment, the material is deposited at a rate of at least 0.3 Angstroms/second.

In a preferred embodiment, the substrate is moved horizontally over the magnetron (in-line) in a reciprocating fashion. In another embodiment the horizontal substrate is rotated about its vertical axis on a platen substrate holder.

In one embodiment the application of material to form an initial sublayer is applied with no or a reduced quantity of oxygen in the coating chamber whereupon oxygen is subsequently introduced into the coating chamber during the formation of the remainder of the layer.

The formation of the sublayer acts to form a barrier layer and as a result at least partially protect the polymer once the oxygen or equivalent gas is introduced and the remainder of the layer is formed. It is known that the OLED polymers are sensitive to and may be damaged by exposure to oxygen. Hence it is preferable that the outer surface of the polymer is not directly exposed to oxygen during the deposition of ITO. This can be avoided in two ways. First if an Indium-tin target is being used, a thin layer of InSn is deposited before oxygen is admitted to the system. The initial layer forms a barrier that prevents direct exposure of the polymer surface to the oxygen. However this thin layer is not transparent and will potentially lead to a small loss in transmission. Alternatively, if an Indium tin oxide target is used, a thin layer is deposited before oxygen is admitted to the system. Although this thin layer is likely to be oxygen depleted, it still acts as a barrier but the absorption is much reduced. Oxygen or equivalent and/or plasma is provided soon after the thin barrier layer is deposited to ensure maximum transmission.

In one embodiment, exposure of the polymer of the device to Ultra Violet light is minimised by conditioning the targets of material to be applied behind a shield or shutter and only when the targets are fully conditioned are the polymer substrates exposed to the indium tin oxide flux, and hence UV. Typically, only a thin layer of material is needed to protect the polymer from the UV exposure.

The method can be performed in batch production in which case the devices are typically held on a carrier which is rotatable in the chamber or in a continuous in line application system in which case the carrier allows linear movement of the devices.

In one embodiment the method includes the step of increasing the gas flow into the coating chamber when the deposition of the material is commencing.

In one embodiment the apparatus and method are used for the deposition of a cathode, which preferably is transparent, for an opto-electronic device. In addition, or alternatively, the apparatus and method are used for the formation of an electrode layer in a device whether that be an electronic or optoelectronic device. In a yet further embodiment the apparatus and method are used for the formation of an anode layer on a device, whether that be an electronic or opto-electronic device.

In a further aspect of the invention there is provided an OLED device having a layer of electroluminescent polymer onto which is applied directly or indirectly a layer of material, said material applied using a closed field unbalanced magnetron sputtering method.

In one embodiment the device is placed in or passed through the plasma which is generated so as to have the material applied thereto. In an alternative embodiment the device is positioned adjacent to the plasma which is generated.

In a further aspect of the invention there is provided a method of forming an electrode for an electronic or opto electronic device said method including the deposition of the material to form the electrode layer from at least one target by sputtering in a closed field magnetron and/or magnet array configuration in a coating chamber.

The electrode may be, for example, an anode or a cathode. The electrode may be deposited directly onto a substrate such as glass or plastic. In this case, the method of the invention may be particularly advantageous for deposition of the electrode onto a flexible substrate, for example a flexible plastic substrate or flexible glass/plastic laminate substrate.

In one embodiment the said layer includes a sub layer closest to the polymer which is formed from material applied in the presence of less oxygen than during the application of the remainder of the material which forms the layer. In one embodiment the said material is applied initially with no oxygen being introduced into the coating chamber for a predetermined period of time.

In one embodiment the OLED is a top emissive OLED and the said layer forms a layer on the opposing side of the polymer layer from the substrate. In one embodiment the said layer of material is capped with a protective material.

In a yet further aspect of the invention there is provided a method of depositing a material to form a layer as part of an electronic or optoelectronic device, said method allowing the deposition of material from a magnetron target and including the steps of generating a plasma in a coating chamber and contacting a substrate of the device with the plasma which is generated to form a layer of the material on the substrate.

In one embodiment the substrate is passed through the plasma to contact the same.

The plasma is typically located within a field, preferably a closed field, generated by a magnetron and/or magnet array.

In a further aspect of the invention there is provided a method for depositing a layer of material onto an electronic device to form a layer which in use of the device acts as an electrode, said method including the steps of placing the device into a coating chamber having at least one target of the material to be deposited, providing the target as part of a magnetron in the coating chamber and operating the magnetron as part of a closed field configuration to sputter deposit material onto the device to form the layer.

In one embodiment the device is an opto-electronic device, preferably an OLED.

In a further aspect of the invention there is provided a method for the application of material to form a layer of an electronic or optoelectronic device, said method including the steps of placing a substrate to which the material is to be applied in a coating chamber, introducing a gas or gasses into the coating chamber and operating a magnetron and/or magnet array in the coating chamber to sputter deposit the said material from at least one material target associated with the magnetron and/or magnet array, wherein the magnetron and/or magnet array are arranged such that the polarity of an outer magnet of a first magnetron and/or magnet array is the opposite of the polarity of the outer magnet of at least one magnetron or magnet array adjacent thereto.

In one embodiment the magnetron and/or magnet array comprises at least one unbalanced magnetron. Typically the layer formed from the material functions as an electrode in the electronic or optoelectronic device.

Specific embodiments of the invention will now be described with reference to the accompanying drawings.

In FIG. 1 there is illustrated apparatus in plan and in a schematic manner in a form which can be used for a batch coating process for OLED devices. In this apparatus there is provided a coating chamber 2 in which there is disposed two sets of opposing unbalanced magnetrons 4,6; 8,10. A magnetron typically comprises an inner magnet(s) and an outer magnet(s). The outer magnet typically forms a ring around the inner magnet and in an unbalanced magnetron, the outer magnet is preferably stronger than the inner magnet. The unbalanced magnetrons include a target 12 of indium tin oxide. The magnetrons are arranged to operate in a closed field configuration in that magnetrons are arranged around a carrier 9 in the chamber 2 which is centrally spaced relative to the magnetrons. The magnetrons are arranged so that adjacent magnetrons have outer magnetic assemblies 14 of opposite polarity, to those adjacent thereto hence allowing magnetic field lines to link adjacent magnetrons so as to produce a substantially closed ring of magnetic flux which substantially traps all electrons generated in the system and increases the level of ionisation surrounding the carrier. It should be appreciated that some of the unbalanced magnetrons may be replaced by arrays of magnets with suitable magnetic configuration to retain the closed field of magnetic flux in the coating chamber The carrier 9 is provided in the form of a drum driven to rotate about axis 13 and on the external surface 11 of which can be mounted the batch of OLED devices (not shown) in a spaced configuration around the drum surface. The devices are mounted such that the external surface of the same which is to be coated, which in this case will be the exposed surface of the polymer layer of the device, faces towards the unbalanced magnetrons.

Typically a shutter or shield 15 is provided in place between the targets 12 and the carrier 9 until the application of the material onto the devices is required. The shields allow the targets to be masked from contamination and as a result reduces the conditioning or cleaning of the same which is required to occur before the deposition of material. The provision of the shutter or shield also allows the conditioning of the targets to occur prior to exposing the targets to the devices by removing the shield or shutter.

Inlet means are provided to allow the selective introduction of working gases into the chamber and pumps are provided in order to allow the pressure in the chamber to be controlled. Also provided are means to ensure that the carrier 9 and hence the devices are held at floating potential in the chamber during the coating procedure.

In operation, power is applied to the magnetrons under controlled conditions via power supplies 20, 21, 22, 23 respectively so that the devices, which are mounted on the rotating carrier receive coating flux material from the targets as they pass the same and as a result the layer of the material is built up to the required thickness. The carrier is insulated from the body of the machine to allow it to float electrically (or for a bias voltage to be applied). For electrically conducting targets, dc power may be used. Pulsed dc is preferred for overall process stability. RF or pulsed dc is required in the event that substrate biasing is preferred.

Typical operating parameters as follows:

Magnetron power: 300 to 3 kW [the deposition rate is a linear function of magnetron power]

Oxygen flow: typically 1 to 8 sccms [initial deposition carried out without oxygen flow for typically 30 to 120 seconds]

Argon flow: typically 10 to 30 sccms

Base pressure: typically $1.10^{-5}$ mbar

Temperature: Substrate at ambient temperature

Figure 2:
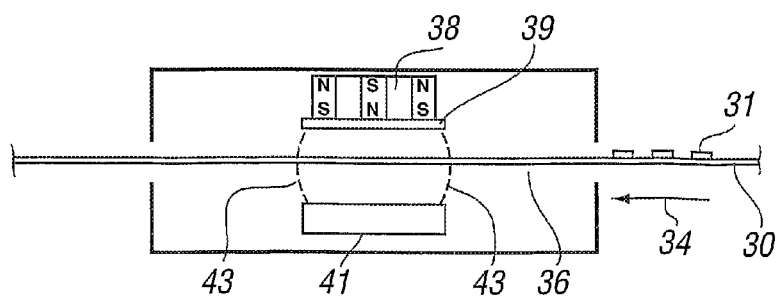
FIG. 2 illustrates an apparatus in accordance with a further embodiment of the invention.

FIG. 2 illustrates alternative apparatus in accordance with an in line coating operation which allows the devices 31 to be coated to be carried on carrier 30 and moved in a linear path as indicated by arrow 34 through a coating chamber 36 in which an unbalanced magnetron 38 with a target 39 of the material to be applied are arranged in a closed field configuration with a magnet array 41 to the opposing side of the carrier 30 which ensures that the devices pass through the closed filed magnetic flux indicated by broken lines 43. Thus as the devices pass the magnetrons, the material sputtered therefrom falls onto the devices to form the coating of the required thickness. It is envisaged that this apparatus will be of practical benefit in allowing greater throughput of the devices to be coated. The same or similar operating parameters as set out with regard to the apparatus of FIG. 1 will be applicable.

Although not shown a loading/unloading chamber or chambers can be provided in selective communication with the coating chamber of either of FIGS. 1 and 2. Initially the loading/unloading chamber is provided at room pressure to allow the devices to be coated to be loaded therein. Once loaded the loading/unloading chamber is evacuated to vacuum at which point the chamber is opened to the coating chamber. The reverse procedure can be followed for unloading the devices. The use of the loading/unloading chamber ensures that the targets within the coating chamber are held in vacuum and hence not exposed to potential damage.

Figure 3:
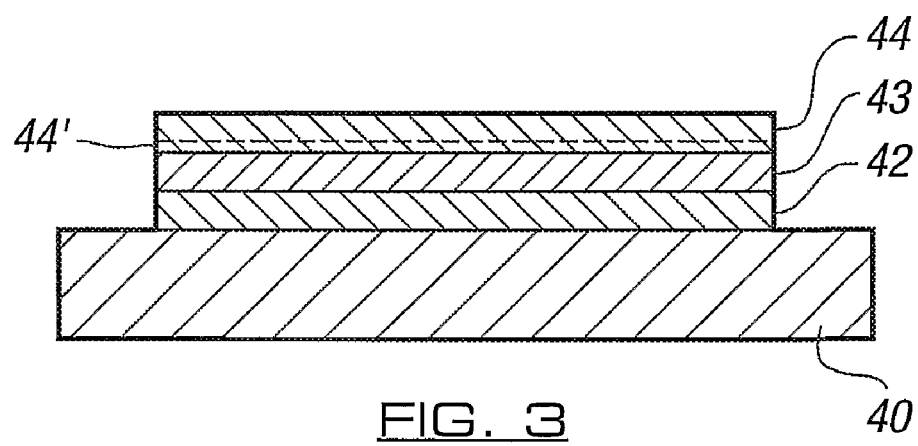
FIG. 3 illustrates a top emissive OLED coated in accordance with one embodiment of the invention.

FIG. 3 illustrates an OLED in cross section which has had the layer of ITO material applied using the apparatus as described in FIG. 1 or 2. It will be seen that the OLED which in this case is a top emissive OLED, has a substrate 40, on which is applied a layer of ITO 42 to act as an anode, a layer of polymer material 43 which can be selected to provide the required visual effect when activated, and a layer of ITO 44 applied using the apparatus and method as herein described. It will be appreciated that due to no or minimum damage being caused by the application of the material layer 44 to the polymer layer 42, there is no longer in this example for a need for a barrier layer to be applied between the polymer layer 42 and the ITO 44. If a barrier layer was required this could still be applied but to a lesser thickness than is conventionally the case. Also illustrated is how a sublayer 44' can be applied using the apparatus with this sublayer acting as the interface with the polymer layer. This sublayer can be applied with no or a lesser amount of oxygen present in the coating chamber than during the application of the material to form the remainder of the layer 44.

Test results have been obtained for a set of OLEDs with a layer of ITO applied to the same in accordance with one embodiment of the invention.

In the preparation of this set of results, ITO was sputtered onto a device comprising, in sequence, the following layers:
Glass substrate
Indium-tin oxide anode
Poly(ethylene dioxythiophene)/polystyrene sulfonate available from HC Starck of Leverkusen, Germany as Baytron P
Electroluminescent layer of green or blue electroluminescent polyfluorene
Calcium (ca. 5-10 nm)
Aluminium (10 or 20 nm)

Two process conditions were tested for ITO deposition, one with a deposition rate of 1.3 A/sec, and a second with a faster deposition rate in the order of 4 A/sec. It was found that there is little difference in device performance between these two rates.

Steps were taken to reduce the risk of air exposure during the sputtering process. In particular, oxygen was excluded from the coating chamber for the deposition of the first 8 nm depth of the ITO layer.

The approximate time of exposure of the samples to atmosphere was 7 minutes prior to coating and 7 minutes subsequent to the application of the coating.

With regard to current-voltage-luminance (IVL) measurements the devices were encapsulated using metal cans containing a getter (available from Saes Getters SpA) before IVL testing.

Table 1 summarises the drive voltage and peak cd/A for deposition of ITO at 4 A/sec. The controls are taken from devices onto which no ITO was deposited. A consequence of using the relatively opaque material aluminium is that there is relatively little top-emission in these devices. Device results set out below are therefore for bottom emission, but nonetheless serve to illustrate the low sputter damage resulting from the method of the invention.

TABLE 1

| Split | Green | | Blue | |
|---|---|---|---|---|
| | Voltage (100 cd/m2) | Peak cd/A | Voltage (100 cd/m2) | Peak cd/A |
| Ca Control | 2.69 | 10.98 | 8.21 | 3.91 |
| Ba Control | | | 6.64 | 4.88 |
| Ca/20 nm Al | 3.81 | 8.84 | 8.70 | 2.81 |
| Ca/10 nm Al | 4.27 | 7.91 | 9.04 | 0.99 |
| Ba/20 nm Al | 3.48 | 10.45 | 6.96 | 5.15 |
| Ba/10 nm Al | 3.55 | 7.52 | 7.83 | 3.57 |

From this table it can be identified that the green samples have an increased drive voltage ~1 V. The efficiency of the green samples drops by 5-15% with the 20 nm Al barrier, increasing to 20-30% when the barrier layer is reduced to 10 nm and the green devices show little difference between Ca and Ba cathode.

The blue devices show increased drive voltage ~0.3V for 20 nm barrier, increasing to ~1V for 10 nm barrier. The blue devices with Ba cathode show little efficiency drop with 20 nm Al, and 20-30% drop with the thinner 10 nm Al barrier.

These results show that the level of damage from the ITO deposition process in accordance with the invention leads to a drop in efficiency of the order 20-30% for both green and blue devices when a 10 nm Al barrier is placed on top of the electron injection layer. Increasing the thickness of the barrier to 20 nm leads to a corresponding reduction in the level of damage and the efficiencies are in the range 5-15% lower than the controls.

The apparatus and method herein described therefore provides improvement in the ability to apply a material by sputter deposition onto an OLED device or similar and to do so in a manner such that the layer of material can be applied directly onto the polymer layer or, if a barrier layer is to be provided between the polymer layer and the material, with the possibility of reduction in the thickness of the barrier layer in comparison with the conventional barrier layers provided and generally reducing the risk of damage caused by the sputter application of the material.

The invention claimed is:

1. Apparatus for the application of a layer of material by sputter deposition onto an organic electroluminescent device, said device including an electroluminescent layer applied directly or indirectly to a substrate, said apparatus including a holder for the device and on which the device is located in a coating chamber, said coating chamber including at least one target of the material to be deposited onto the device, said target provided as part of an unbalanced magnetron, said coating chamber including at least one other magnetron and/or magnet array and wherein said magnetrons and/or magnet array are mutually located in the coating chamber such that the polarity of the outer or ring magnet of a first magnetron or magnet array is the opposite to the polarity of the outer or ring magnet of at least one magnetron or magnet array adjacent thereto and the material is applied with a material deposition energy in the coating chamber of less than 50 eV.

2. Apparatus according to claim 1 wherein the closed field configuration includes a series of unbalanced magnetrons.

3. Apparatus according to claim 2 wherein each of the unbalanced magnetrons is provided with a target of the material which can be selectively applied during the coating process simultaneously or sequentially with material from further targets of material.

4. Apparatus according to claim 1 wherein the closed field configuration includes at least one magnet array which is not provided for the deposition of material but is magnetically configured and positioned with respect to at least one magnetron in the coating chamber so as to provide said closed field configuration.

5. Apparatus according to claim 1 wherein the magnetron and/or magnet array configuration allows the retention of the magnetic flux within the coating chamber and hence retains the relatively dense plasma within the coating chamber.

6. Apparatus according to claim 5 wherein the devices to be coated are positioned within the plasma.

7. Apparatus according to claim 5 wherein the devices to be coated are positioned adjacent the plasma.

8. Apparatus according to claim 1 wherein the organic electroluminescent device includes a series of layers and at least one of the layers is applied using apparatus other than that of the closed field configuration.

9. Apparatus according to claim 8 wherein the apparatus is provided as part of a coating assembly, said assembly including at least one further arrangement for the forming of a further layer on the device.

10. Apparatus according to claim 9 wherein the further arrangement includes any, or any combination of, an inkjet printer and/or an encapsulator.

11. Apparatus according to claim 10 wherein the closed field configuration deposition apparatus, inkjet printer and/or encapsulator are provided as part of an integrated coating assembly with movement means provided to move the device through and past the layer forming apparatus.

12. Apparatus according to claim 1 wherein at least one of the targets of the unbalanced magnetrons is formed of a material to be applied to the devices to form a barrier layer over the electroluminescent layer prior to the application of the material to form a cathode device.

13. Apparatus according to claim 1 wherein the device onto which the material is to be applied has previously been formed with an anode layer, and an electroluminescent layer and cathode layer is applied thereon either directly or onto a barrier layer covering the electroluminescent layer.

14. Apparatus according to claim 13 wherein the barrier materials are selected from wide bandgap semi conductors, ZnS, ZnSe, organic materials, and Cu Pc.

15. Apparatus according to claim 14 wherein the barrier layer is deposited directly onto the electroluminescent layer.

16. Apparatus according to claim 14 wherein one or more additional layers are disposed between the electroluminescent layer and the barrier layer.

17. Apparatus according to claim 1 wherein the material which is applied onto the device is selected from tin oxide or doped zinc oxide.

18. Apparatus according to claim 1 wherein a plurality of the devices are provided as a batch in the coating chamber to allow the material to be applied thereto.

19. Apparatus according to claim 18 wherein the devices are mounted in a holder or carrier in a form of a drum or carousel driven to rotate about an axis and located within the unbalanced magnetron closed field.

20. Apparatus according to claim 1 wherein the holder employs a planetary motion drive arrangement to move the devices within the chamber.

21. Apparatus according to claim 1 wherein the device is held horizontally on a non rotating or rotating platen.

22. Apparatus according to claim 1 wherein the devices are transported into the coating chamber by a drive mechanism which allows the devices to move in a linear path to pass through the coating chamber.

23. Apparatus according to claim 1 wherein control means are provided to allow a suitable gas or gasses to be selectively introduced into the coating chamber.

24. Apparatus for claim 1 wherein the apparatus includes one or more loading or unloading chambers which are connected to the coating chamber and which can be held selectively at room pressure or in a vacuum.

25. Apparatus for the application of a layer of material by sputter deposition onto an organic electroluminescent device, said device including a substrate having an anode layer and an electroluminescent layer applied directly or indirectly thereto, said apparatus including a holder for the device and on which the device is located in a coating chamber, said coating chamber including at least one target of the material to be deposited onto the device, said target provided as part of an unbalanced magnetron, said coating chamber including at least one other magnetron and/or magnet array and wherein said magnetrons and/or magnetic array are mutually located in the coating chamber such that the polarity of the outer or ring magnet of a first magnetron or magnet array is the opposite to the polarity of the outer or ring magnet or at least one magnetron or magnet array adjacent thereto and the layer of material is applied in the coating chamber onto the exposed outer surface of the device formed by the electroluminescent layer or onto a barrier layer overlying said electroluminescent layer.

26. Apparatus for the application of a layer of material by sputter deposition onto an organic electroluminescent device, said device including an electroluminescent layer applied directly or indirectly to a substrate, said apparatus including a holder for the device and in which the device is located in a coating chamber, said coating chamber including at least one target of the material to be deposited onto the device, said target provided as part of an unbalanced magnetron, said coating chamber including at least one other magnetron and/or magnet array and wherein said magnetron and/or magnet array are mutually located in the coating chamber such that the polarity of the outer or ring magnets of the first magnetron or magnet array is the opposite to the polarity of the outer or ring magnet of at least one magnetron or magnet array adjacent thereto.

27. A method for the application of material to form a layer of an electronic or optoelectronic device, said method including the steps of placing the device to which the material is to be applied in a coating chamber, introducing a gas or gasses into the coating chamber, operating one or a series of unbalanced magnetrons in the coating chamber which may also be used to sputter deposit the said material from at least one material target associated with the unbalanced magnetron in a directed manner onto the device.

28. A method according to claim 27 wherein the magnetrons and/or magnet arrays are arranged such that the polarity of the outer or ring magnet of a first magnetron or magnet array is the opposite of the polarity of the outer or ring magnet of at least one magnetron or magnet array adjacent thereto.

29. A method according to claim 27 wherein the material is applied with no bias voltage applied to the substrates during deposition of the material.

30. A method according to claim 27 wherein the substrates achieve a floating potential within the chamber.

31. A method according to claim 30 wherein the floating potential is less than 50 volts and the material deposition energy is less than 50 eV.

32. A method according to claim 27 wherein an inert gas is introduced into the chamber and the inert gas is retained substantially within a field generated by the magnetron and/or magnet array.

33. A method according to claim 27 wherein the layer formed from the material functions as an electrode in the electronic or optoelectronic device.

34. An OLED device having a layer of electroluminescent polymer onto which is applied directly or indirectly, a layer of material, said material applied using a closed field unbalanced magnetron method.

35. A method of forming an electrode for an electronic or opto electronic device, said method including the sputter deposition of a material from at least one target to form an electrode layer in a closed field magnetron and/or magnet array configuration in a coating chamber.

36. A method of depositing material to form a layer as part of an electronic or optoelectronic device, said method allowing the deposition of material from a magnetron target and including the steps of generating a plasma in a coating chamber and contacting a substrate of the device with the plasma which is generated to form a layer of the material on the substrate.

37. A method according to claim 36 wherein the substrate is passed through the plasma to contact the same.

38. A method according to claim 36 wherein the plasma is located within a field generated by a magnetron and/or magnet array.

39. A method according to claim 36 wherein the layer formed from the material functions as an electrode in the electronic or optoelectronic device.

40. A method for depositing a layer of material onto an electronic device to form a layer which in use of the device acts as an electrode, said method including the steps of placing the device into a coating chamber having at least one target for the material to be deposited, providing the target as part of a magnetron in the coating chamber and operating the magnetron as part of a closed field configuration to sputter deposit material onto the device to form the layer.

41. A method for the application of material to form a layer of an electronic or optoelectronic device, said method including the steps of placing a substrate to which the material is to be applied in a coating chamber, introducing a gas or gasses into the coating chamber and operating a magnetron and/or magnet array in the coating chamber to sputter deposit the said material from at least one material target associated with the magnetron and/or magnet array, wherein the magnetron and/or magnet array are arranged such that the polarity of an outer magnet of a first magnetron and/or magnet array is the opposite of the polarity of the outer magnet of at least one magnetron or magnet array adjacent thereto.

42. A method according to claim 41 wherein the magnetron and/or magnet array comprises at least one unbalanced magnetron.

43. A method according to claim 41 wherein a layer of material is first applied to form a barrier layer on the substrate.

44. A method according to claim 41 wherein a barrier layer is first applied to the substrate of the device prior to the subsequent layer of material and the barrier layer is applied with no or minimum oxygen or equivalent gas or plasma present in the coating chamber.

45. A method according to claim 44 wherein once the barrier layer has reached a desired thickness, oxygen or an equivalent gas is introduced and/or a plasma is created in the coating chamber to control the electrical properties of the layer of material which is subsequently applied.

46. A method according to claim 41 wherein the layer formed from the material functions as an electrode in the electronic or optoelectronic device.

* * * * *